United States Patent [19]
Wightman

[11] Patent Number: 5,850,565
[45] Date of Patent: Dec. 15, 1998

[54] DATA COMPRESSION METHOD AND APPARATUS

[75] Inventor: Andrew Thomas Wightman, Purbrook, England

[73] Assignee: Novell, Inc., Orem, Utah

[21] Appl. No.: 697,292

[22] Filed: Aug. 26, 1996

[51] Int. Cl.[6] .................................................. G06F 11/34
[52] U.S. Cl. .......................... 315/821; 395/888; 395/309
[58] Field of Search .................................... 395/821, 309, 395/888, 892; 707/10; 341/67, 95, 106; 370/473

[56] References Cited

U.S. PATENT DOCUMENTS

| | | | |
|---|---|---|---|
| 4,701,745 | 10/1987 | Waterworth | 340/347 |
| 5,016,009 | 5/1991 | Whiting et al. | 341/67 |
| 5,126,739 | 6/1992 | Whiting et al. | 341/106 |
| 5,229,768 | 7/1993 | Thomas | 341/51 |
| 5,261,060 | 11/1993 | Free | 395/309 |
| 5,446,888 | 8/1995 | Pyne | 707/10 |
| 5,479,654 | 12/1995 | Squibb | 395/600 |
| 5,598,543 | 1/1997 | Notarianni et al. | 395/309 |

FOREIGN PATENT DOCUMENTS 0 713 183 A2   5/1996   European Pat. Off. .

*Primary Examiner*—Robert W. Beausoliel, Jr.
*Assistant Examiner*—Pierre Eddy Elisca
*Attorney, Agent, or Firm*—Cesari and McKenna LLP

[57] ABSTRACT

A data compressor scans one or more data files to locate variable-length strings of characters (data) that can be more efficiently compressed by delta compression (i.e. by referring to a string in an earlier version of the data file) than by traditional compression (i.e. by referring to a string of characters that occurs earlier in the data file). The compressor employs a criterion to select the strings that are likely to be most amenable to delta compression, i.e. to provide the highest overall compression ratio. The compressor creates a dictionary that describes the selected strings, which can then be advantageously used to delta-compress edited (changed) versions of the data files for transmission to another computer. In addition, a "dual-mode" data compressor employs a combination of delta and traditional compression to efficiently compress data and send one or more files from a sending computer to a receiving computer, where a decompressor reconstitutes a copy of the files. As the dual-mode compressor processes the files, it creates a dictionary.

19 Claims, 5 Drawing Sheets

DATA COMPRESSION METHOD AND APPARATUS

BACKGROUND OF THE INVENTION

1. Field of the Invention

The invention relates to data compressor techniques for use in computer systems and more particularly to a data compression technique that compresses data files by identifying portions of those files that are identical to data previously stored on a receiving computer.

2. Description of the Related Art

Many computers exchange data with other computers over data links. Some of these data links are established only for the duration of each data exchange. For example, some users of personal computers (PCs) use modems to "download" (transfer) files from the Internet over telephone lines. Other data links, such as local area networks (LANs), are established more permanently.

Regardless of the permanence of the data links, efforts are made to maximize the effective rate at which data can be transferred over the links. Several data compression techniques have been developed to reduce the amount of time taken to transfer data over the links. One data compression technique, referred to hereinafter as "traditional compression," uses a compressor to scan the data for patterns that occur more than once and assign a "token" to each of these patterns. Instead of sending the data patterns each time they occur, the traditional compressor sends each data pattern only once and thereafter sends the tokens that represent the data patterns. Traditional compression reduces the time taken to transfer the data because each token is shorter than its corresponding data pattern. U.S. Pat. No. 5,016,009 to Douglas L. Whiting, et al, titled "Data Compression Apparatus and Method," describes several traditional data compression techniques in more detail.

Another data compression technique, referred to hereinafter as "delta compression," can be used when the receiving computer already stores an earlier version of the file that is being transferred. A delta compressor attempts to send only the portions of the file that are different than the earlier version of the file. For example, when a user down-loads a file from a source computer to a PC, then edits (changes) part of the file on the PC, and finally uploads the edited file from the PC back to the same source computer, during the uploading process, the source computer still stores the earlier, unedited version of the file. Generally, the user does not change the entire file, so portions of the earlier-version file remain identical to portions of the edited file.

The entire earlier-version file is divided into fixed-sized blocks and a "dictionary" describes the contents of each of these blocks. Each dictionary entry typically contains an address of the corresponding block in the earlier-version file along with a CRC value that has been calculated from the data in the block. The dictionary is sent by the computer that stores the earlier-version file to the computer that stores the edited file.

The delta compressor uses the dictionary to locate identical blocks in the edited file in an effort to avoid sending the identical blocks over the link. Typically, the delta compressor uses a "sliding window" to examine fixed-sized portions of the edited file. For each window of data examined, the delta compressor calculates a CRC value from the data and then compares the calculated value to the CRC values that are stored in the dictionary. If the calculated CRC value matches that of one of the dictionary entries, the delta compressor assumes that the data in the window is identical to the data in the corresponding block of the earlier-version file. Instead of sending the identical data over the link, the delta compressor sends the address of the identical block in the earlier-version file and a decompressor at the receiving computer copies the identical block from the earlier-version file. U.S. Pat. Nos. 5,466,888 to Charles F. Pyne, titled "Remote File Transfer Method and Apparatus," and 5,479,654 to Mark Squibb, titled "Apparatus and Method for Reconstructing a File from a Difference Signature and an Original File," describe several aspects of delta compression in more detail.

Neither traditional nor delta compression provides a satisfactory reduction in the time taken to transfer a file. Traditional compression does not substantially reduce the time taken to transfer the file for two reasons. Although traditional compressors replace repeated data patterns with shorter tokens, a file that does not contain many repeated data patterns cannot be effectively and timely compressed. In addition, traditional compressors must initially send each data string constituting a repeated data pattern and all further data that is not part of a repeated pattern, even if the receiving computer already stores such data.

On the other hand, delta compression does not make efficient use of the data stored in earlier-version files because, thusfar, files have not been divided into "optimum" blocks. The efficiency of a delta compressor depends partly on the size of the blocks that are described by the dictionary entries and partly on the "usefulness" of the dictionary entries. Dictionary entries that describe small blocks do not enable the delta compressor to provide an acceptably high "compression ratio," i.e., the number of bits of data that are to be compressed divided by the number of bits that are actually transmitted to the receiving computer.

Dictionary entries that describe large blocks theoretically provide a high compression ratio. However, dictionary entries that describe large blocks may not be used by the delta compressor because it is unlikely that these blocks remain unedited. Only dictionary entries that describe unedited (unchanged) portions of a file are used by the delta compressor. Increasing the block size also increases the probability that the user will have made a change somewhere in the block. Users' edits tend to occur at random (unpredictable) locations throughout a file, so most dictionary entries that describe large blocks are not used.

SUMMARY OF THE INVENTION

The invention provides an improved data compressor that scans one or more data files to locate variable-length strings of characters (data) that can be more efficiently compressed by delta compression than by traditional compression. The compressor employs a novel technique to select the strings that are likely to be most amenable to delta compression, i.e. to provide the highest overall compression ratio. Specifically, the technique includes the creation of an "optimum" dictionary that describes the selected strings, which can then be advantageously used to delta-compress edited (changed) versions of the data files for transmission to another computer. Each dictionary entry has a corresponding "key" by which the entry can be selected. The dictionary does not necessarily describe the whole of the data files.

The invention also provides a "dual-mode" data compressor that employs a novel combination of delta and traditional compression operations to efficiently compress data and send one or more files from a sending computer to a receiving computer, where a decompressor reconstitutes a copy of the files. As the dual-mode compressor processes the files, it advances a "current character" pointer through the data of the files. For each current character, the compressor selects whether to delta-compress or traditionally compress the string of characters that begins with the current character. The selection of the compression mode depends on which technique can compress the string with a higher compression ratio. The dual-mode compressor is particularly efficient when operated in conjunction with the optimum dictionary.

In an illustrative embodiment, the compressor locates the variable-length strings for the optimum dictionary by sequentially reading portions of the data files into a buffer and scanning the buffer for strings that can be traditionally compressed. Strings that occur between the traditionally-compressible strings are referred to as "incompressible" strings. The compressor calculates a "figure of merit" for each incompressible string from the length of the string and its frequency of occurrence in the input files. Strings having the largest figures of merit are described in the optimum dictionary.

Strings that are relatively long and/or occur frequently in the data files have large figures of merit. Dictionary entries that describe frequently-occurring strings are likely to be used by a delta compressor because, even if a user edits (changes) one or more occurrences of one of these strings, other occurrences are likely to remain unchanged and are, therefore, amenable to delta compression. Long strings are more efficiently compressed by a delta compressor than by a traditional compressor because the traditional compressor must send each of the strings at least once, whereas the delta compressor need not send the strings at all and thus provides a higher compression ratio.

Advantageously, the inventive compressor can locate strings that have high figures of merit because the compressor can locate strings that begin anywhere in the data files and can have any length. In contrast, prior compressors employ fixed-length blocks and are therefore restricted to strings that: (1) have the same length and (2) begin at addresses that are whole multiples of the block size. As noted, the improved data compressor uses variable-length strings and is therefore free of these restrictions.

BRIEF DESCRIPTION OF THE DRAWINGS

Further features and advantages of the present invention, as well as the structure and operation of various embodiments of the present invention, are described in detail below with reference to the accompanying drawings. In the drawings, like references indicate similar elements, the left-most digit of each reference number identifies the drawing in which the reference number first appears, and.

DESCRIPTION OF THE PREFERRED EMBODIMENT

Figure 1:
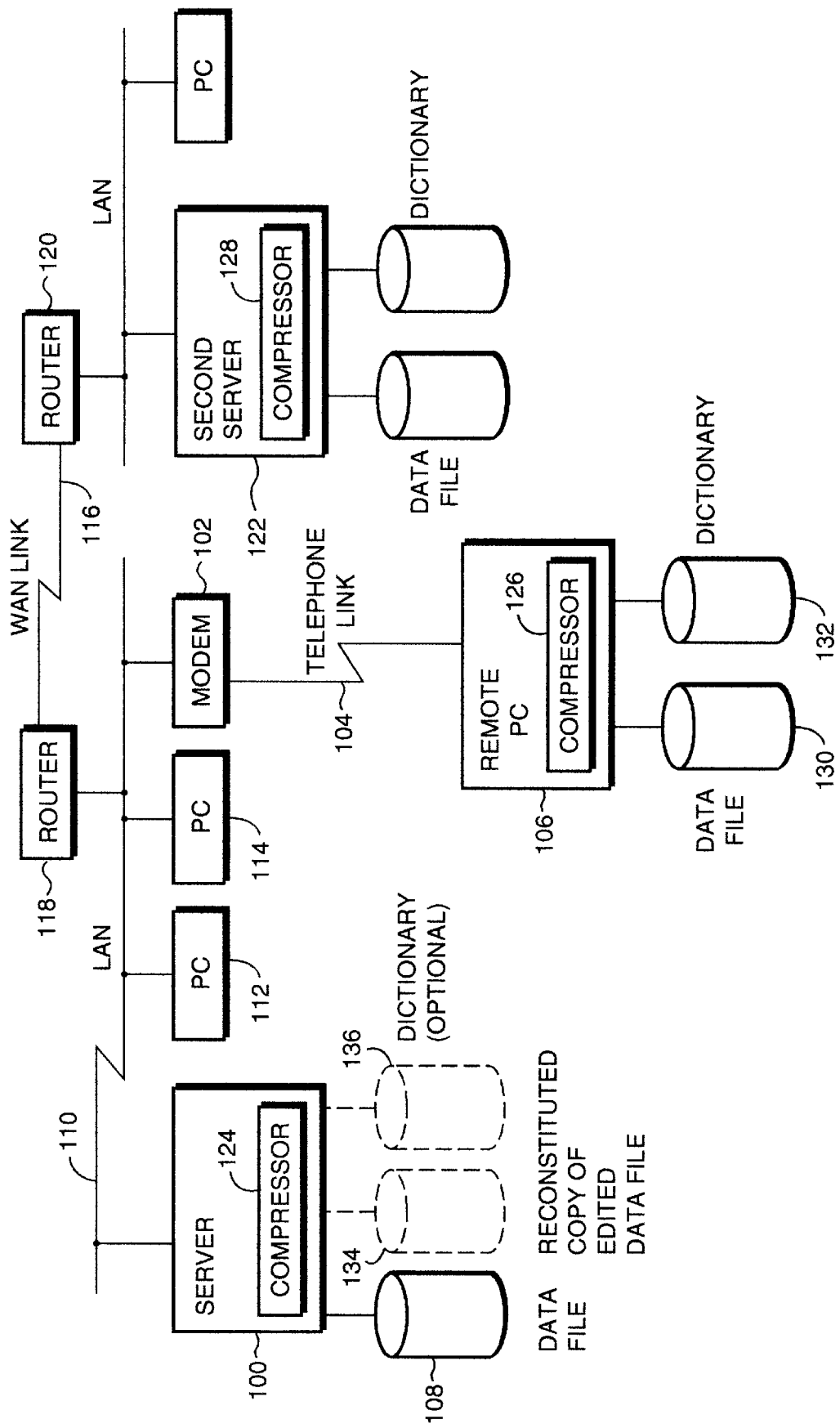
FIG. 1 is a block diagram of two exemplary configurations of computers in which the subject data compressor can advantageously be used.

FIG. 1 illustrates two exemplary configurations of computers in which the subject data compressor can be used advantageously. In the first configuration, a server 100 is interconnected by a modem 102 and a telephone link 104 to a remote PC 106. The server 100 provides file services, such as storing a data file 108 for, and supplying the data file to, the remote PC 106. Typically, the server 100 is also interconnected by a local area network (LAN) 110 to several other computers, such as PCs 112 and 114, and the server provides similar file services to these other computers. In the second configuration, the server 100 is interconnected by a wide-area network (WAN) link 116 and a pair of routers 118 and 120 to a second server 122. The server 100 provides file services, similar to those provided to the PCs 106, 112 and 114, to the second server 122.

In both configurations, the server 100 sends and/or receives data over a link. Typically, this link cannot transport data at a sufficiently high rate, thus data compressors 124 and 126 or 128 can be advantageously used to reduce the amount of time taken to transfer the data. Portions of the data compressors 124,126 and 128 are executed by the sending computer and other portions are executed by the receiving computer.

Use of the subject data compressor is not, of course, limited to slow links. The compressor 124 can, for example, be used to send data over the relatively high-speed LAN 110 between the server 100 and one of the PCs 112 and 114, although the largest advantage is typically gained in configurations in which a relatively slow link interconnects two computers that each have some excess computing capacity. In other words, the compressor consumes computing resources in the process of compensating for a slow link.

The following description is directed to the first configuration, however by analogy the description applies to all configurations in which the subject data compressor is employed. In a first typical scenario, the remote PC 106 requests the server 100 to send a copy of the data file 108 to the remote PC. The server 100 executes a sending portion of the data compressor 124 to compress and send the data file 108 to the remote PC 106. Assuming that no earlier version of the data file 108 is stored by the remote PC 106, the data compressor 124 uses traditional compression to compress and send the data file.

The remote PC 106 executes a receiving portion of the data compressor 126 (a "decompressor") to reconstitute and store the received data in a local copy of the data file 130. The decompressor 126 also creates an optimum dictionary 132 that describes the received data file 130. The dictionary 132 also describes the data file 108 on the server 100 because, at the time the remote PC 106 receives the data file 130, the data file 130 stored by the remote PC is identical to the data file 108 stored by the server.

In a second typical scenario, after a user edits (changes) the contents of the data file 130, the remote PC 106 executes a sending portion of the data compressor 126. The data compressor 126 uses the dictionary 132 and a novel combination of delta and traditional compression to compress and send the edited version of the data file 130 back to the server 100. In response, the server 100 executes a receiving portion of the data compressor 124 (the "decompressor") and uses the earlier version of the data file 108 to reconstitute and store the received data in a new data file 134.

The first of these two scenarios will now be described in more detail. The compressor 124 sequentially reads portions of the data file 108 into a buffer and it scans the buffer for data patterns that occur more than once in the buffer. The first time the compressor 124 encounters data forming the basis of a "repeated data pattern" in the buffer, the compressor sends that pattern to the remote PC 106. Thereafter when encountering repeated data patterns in the buffer, the compressor sends a "reference" to the earlier occurrence of the data pattern. Groups of data that occur between these repeated data patterns and which could not be traditionally compressed are referred to as "unique" (or alternatively "incompressible") data. The compressor 124 sends each group of unique data to the remote PC 106. (As will be described later, the compressor actually encodes the data and references prior to sending them.) Each time the decompressor 126 receives one of these groups of unique data, it adds to the dictionary 132 an entry that describes that unique data. Thus, after the data file 108 has been sent, the dictionary 132 describes "incompressible" portions of the data file.

Figure 2:
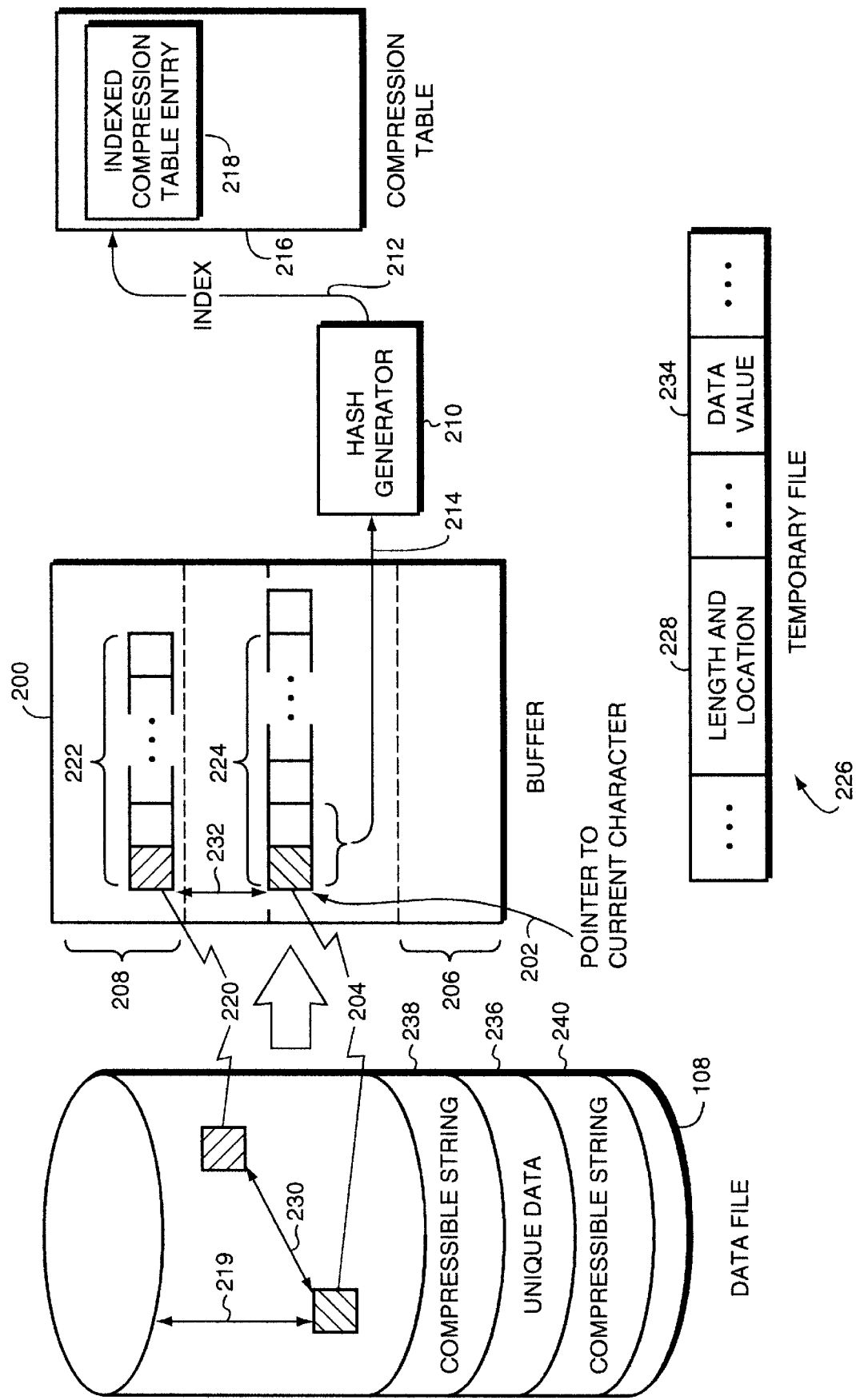
FIG. 2 is a more detailed block diagram of a portion of FIG. 1, namely of part of the inventive data compressor.

FIG. 2 illustrates how the compressor 124 compresses the data file 108. The compressor 124 sequentially reads portions of the data file 108 into a buffer 200. The compressor initially attempts to fill the entire buffer 200 with data from the data file 108. As the compressor 124 processes the data in the buffer 200, it advances a "current-character" pointer 202 through the buffer. The current character pointer 202 points to a "current character" 204. When the position of the current-character pointer 202 indicates that only one quarter 206 of the buffer 202 remains to be processed, the compressor 124 attempts to overwrite the "oldest" quarter 208 of the buffer with more data from the data file 108. In this way the compressor 124 can examine data (characters) that occur prior to the current character 204 in the buffer 200. The number of characters available for examination is initially zero and rises to at least one-half of the buffer size.

For each current character, the compressor 124 ascertains whether a character string that begins with the current character 204 is identical to a character string that occurs earlier in the buffer 200. A hash generator 210 calculates a hash value 212 from three characters 214 beginning with the current character 204. The compressor 124 then uses the hash value 212 to index into a "compression table" 216 to select an indexed compression table entry 218. Initially the compression table 216 is empty, but as the compressor 124 processes the data file 108 the compressor fills in the compression table.

If the indexed compression table entry 218 is empty, the compressor 124 inserts into the indexed compression table entry a value equal to an offset 219 from the beginning of the data file 108 to the current character 204. The contents of the indexed compression table entry 218 enable the compressor 124 to identify an identical string that occurs later in the input file 108, i.e. a later string that is identical to the string that begins with the current character 204. The contents of the compression table entries thus correlate hash values with character locations in the data file 108.

If the indexed compression table entry 218 is not empty and the offset stored therein identifies a character that is no longer in the buffer 200, the compressor 124 replaces the indexed compression table entry 218 with a value equal to an offset 212 from the beginning of the data file 108 to the current character 204. Thus, the compressor 124 searches for repeated strings that are separated by up to three-quarters of the buffer size.

If the indexed compression table entry 218 is not empty and the offset stored therein identifies a character 220 that is still in the buffer 200, the compressor ascertains whether an "earlier string" of characters 222 that begins with the identified character 220 is identical to a string 224 that begins with the current character 204. The compressor 124 compares each character starting with the identified character 220 in the buffer 200 with the characters that begin with the current character 204. The character-by-character comparison operation continues until two unequal characters are found. Because of the dynamic method of reading portions of the data file 108 into the buffer 200 and of comparing the two sets of characters, the length of the comparison is not limited by the size of the buffer. Thus, an identical character string may comprise any length greater than one character. If an identical earlier string 222 is found, the compressor 124 writes to a temporary file 226 an entry 228 that refers to the data file 108 and inserts the length of the earlier string into the temporary file entry. The compressor 124 also copies the string location (offset) to the temporary file entry 228.

The location of the earlier string is indicated by an offset (distance in bytes) 230 between the two strings in the data file 108. This "relative" offset 230 is equal to an offset 232 in the buffer 200 between the current character 204 and the first character 220 of the earlier string 222. Notably, a relative offset is distinguishable from an "absolute offset," which is measured between the beginning of a file and a string. For example, offset 219 is an absolute offset. Note also that two identical relative offsets can refer to two different character strings. The utility of relative offsets will become clear when encoding is described herein.

This method of locating identical strings that occur earlier in the data file 108 also locates strings that consist of repeating patterns of one or more characters, such as "aaaaaa" and "ababab." The relative offsets of such strings equal the number of characters in the shortest pattern that repeats. For example, the relative offset of "aaaaaa" is one.

The contents of the temporary file 226 are eventually encoded and sent to the decompressor 126. When executing on the remote PC 106, the decompressor 126 reconstitutes the string 224 of the data file 108 by copying the earlier string 222 from the reconstituted data file 130 (more accurately, from an output buffer (not shown), which is the same size as the buffer 200 used to compress the data file 108).

If the character string that begins with the current character 204 is not identical to a character string that occurs earlier in the buffer 200, the compressor 124 writes to the temporary file 226 an entry 234 that includes the data value of the current character 204. This is referred to as a "unique character." Note that several consecutive unique characters, referred to as a "unique character string," can be written to the temporary file 226. When the decompressor 126 executes on the remote PC 106, it reconstitutes the corresponding portion of the data file 108 by inserting the unique character(s) into the reconstituted data file 130.

After writing to the temporary file 226, the compressor 124 advances the current-character pointer 202 beyond the last identified string or unique character in the buffer 200 and the compression process repeats. In other words, if the compressor 124 writes to the temporary file 226 a string of unique characters, it advances the current-character pointer by the length of the string of unique characters, whereas if the compressor writes an offset and length that represents a string 222 in the data file 108, it advances the pointer by the size of the string.

After processing the entire data file 108, the compressor 124 encodes the temporary file 226. The compressor 124 calculates the frequencies with which the unique characters (data values), the relative offset and the lengths are written to the temporary file 226. The compressor 124 then encodes the most frequently-occurring unique characters, relative offsets and lengths into short bit patterns to minimize the number of bits that must be sent to the remote PC 106.

After encoding the temporary file 226, the compressor 124 sends the encoded file to the decompressor 126 on the remote PC 106. The decompressor 126 reads the encoded temporary file and both reconstitutes a copy of the data file 130 and creates an optimum dictionary 132 that describes the data file 130.

DICTIONARY CREATION

Figure 3:
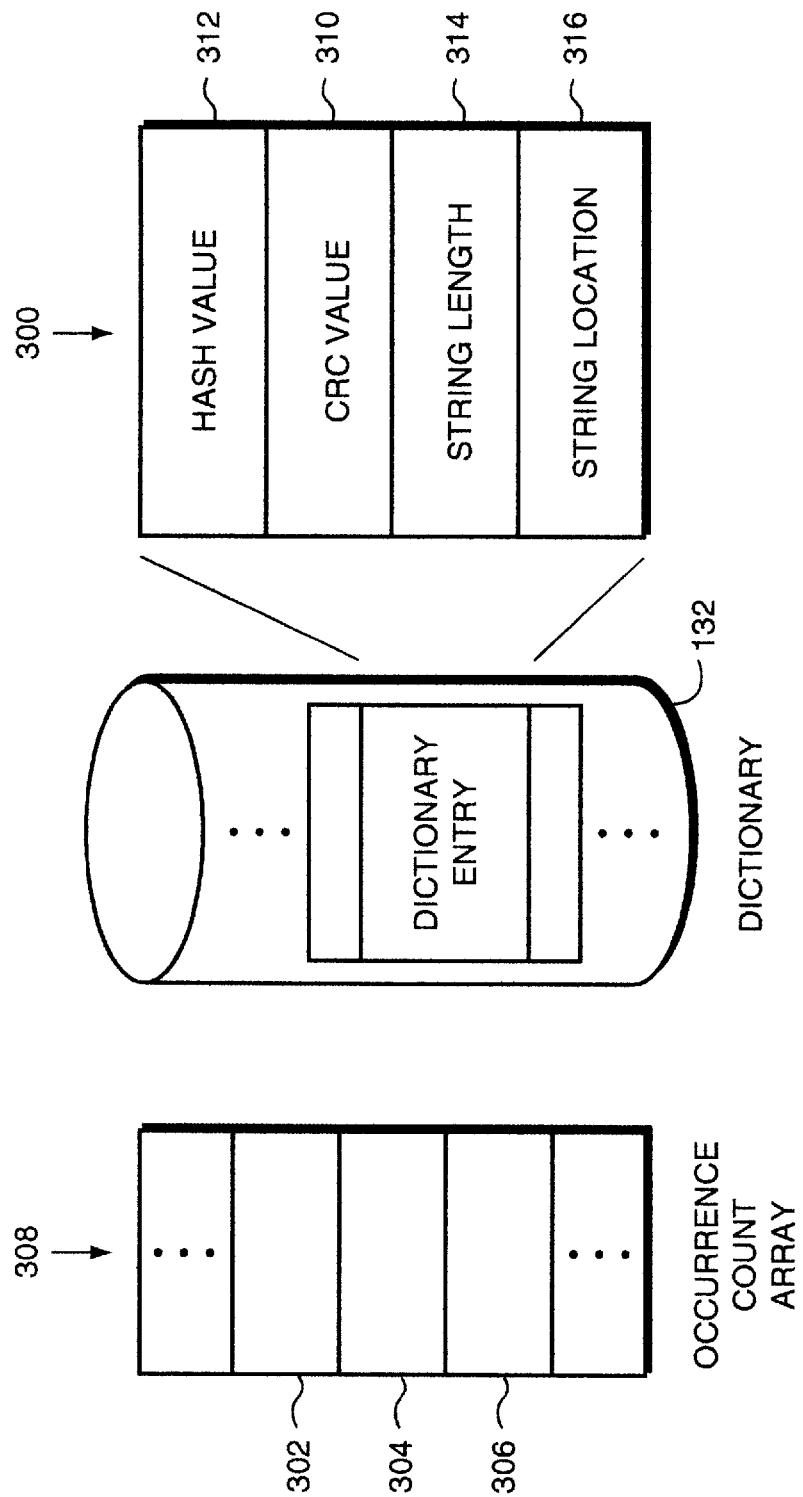
FIG. 3 is a diagram of a dictionary created by the inventive data compressor.

As the decompressor 126 reconstitutes the data file 130, it keeps track of portions (strings) of the data file 108, that were not compressed by the compressor 124 either as repeating patterns of characters or by references to earlier identical strings. For example, the data file 108 might contain a string 236 that contains unique data. The data file 108 might also contain two exemplary strings 238 and 240 that were compressed and that bound the unique string 236. During such reconstitution, the decompressor further keeps track of the location within the data file 108 of the most recent string, e.g. string 238, that was compressed. When the decompressor 126 locates a next string of characters, e.g. string 240, that was compressed, the portion of the data file 108 that lies between the two compressible strings, e.g. string 236, is considered to be an "incompressible string." The decompressor 126 stores in the dictionary 132 the lengths and locations (absolute offsets) within the data file 108 of certain of these incompressible strings. FIG. 3 illustrates the dictionary 132 in more detail, including an exemplary dictionary entry 300.

The decompressor 126 generally does not add entries to the dictionary 132 for incompressible strings that are shorter than a minimum length because these short strings are more efficiently handled by simply inserting them in the temporary file as unique strings. On the other hand, if the incompressible string is longer than a maximum length, the decompressor 126 breaks the incompressible string into two or more strings, each of which is shorter than the maximum length. Strings that are longer than the maximum length are likely to be changed when the data file 130 is modified, so dictionary entries that refer to such large strings are unlikely to assist in compressing the data file 130.

The decompressor 126 maintains "occurrence counts," e.g. counts 302, 304 and 306, in an occurrence count array 308 to keep track of the number of times each incompressible string occurs in the data file 130. For each incompressible string that is to be described by a new dictionary entry, the decompressor 126 calculates a CRC value from the entire string and a hash value from the first three characters of the string. The decompressor then scans the existing dictionary entries to ascertain whether a CRC value (and corresponding hash value and string length) that are stored therein equal the CRC value (and corresponding hash value and string length) of the new entry. If no equivalent CRC value is found, the decompressor 126 adds the new dictionary entry and stores therein: (1) the CRC 310 and hash 312 values, (2) the length 314 of the incompressible string and (3) its absolute offset (location) 316 within the data file 130. If an equal CRC value is found, the compressor assumes that the strings are identical and simply increments the corresponding occurrence count in the array 308.

Although it might at first appear that no duplicate incompressible strings can exist in the data file 130 (because these strings would have been compressed as repeated strings), recall that identical strings of characters that are separated from each other by more than a maximum relative offset value (not exceeding three-quarters of the size of the buffer) are not compressed.

If the decompressor 126 attempts to add an entry to the dictionary 132, but the dictionary has become full, the decompressor replaces the entry that has the lowest "retention value" with the new entry. The retention value of each entry is calculated from the length 314 of the string and the occurrence count, e.g. count 304, whereby short strings with low occurrence counts have low retention values. The size of the dictionary is preferably fixed, but alternatively the size can be set according to the size and type of the data file 108.

After processing the entire temporary file and reconstituting the data file 130, the decompressor 126 calculates a "figure of merit" for each entry in the dictionary 132 from the length 314 of the string and the occurrence count. The decompressor 126 then keeps a maximum number of the most useful entries in the dictionary 132, i.e. the entries that represent long and/or frequently-occurring, incompressible strings. Alternatively, the figure of merit can be calculated according to other algorithms or heuristics that predict the usefulness of dictionary entries. For example, a heuristic might calculate the figure of merit from the contents of the string, possibly in light of the type of data file being processed or the contents of the data file.

The dictionary entries are sorted according to their hash values 312 to facilitate later indexing into the dictionary by those values. Preferably, the dictionary 132 can contain several consecutive dictionary entries that all contain the same hash value 312 (but different CRC values 310). Alternatively, the dictionary 132 is limited to one dictionary entry for each hash value 312.

Optionally, while sending the data file 108, the compressor 124 can also create a dictionary 136 on the server 100 using the method described above. The compressor 124 then calculates a CRC value from the contents of its dictionary 136 and sends this CRC value to the decompressor 126 on the remote PC 106. The decompressor 126 calculates a CRC value from the contents of its dictionary 132 and then compares the two CRC values to ensure that both computers (the server 100 and the remote PC 106) store identical dictionaries.

DUAL-MODE COMPRESSION

Later, after a user edits (changes) the contents of the data file 130 (FIG. 1) stored by the remote PC 106, the remote PC executes a sending portion of the compressor 126 to compress and send the edited version of the data file 130 back to the server 100. The compressor 126 uses the dictionary 132 and a novel combination of delta and traditional compression. The server 100 executes a receiving portion of the compressor 124 (the "decompressor") and uses the earlier version of the data file 108 to reconstitute and store the received data in the new data file 134 on the server.

Figure 4:
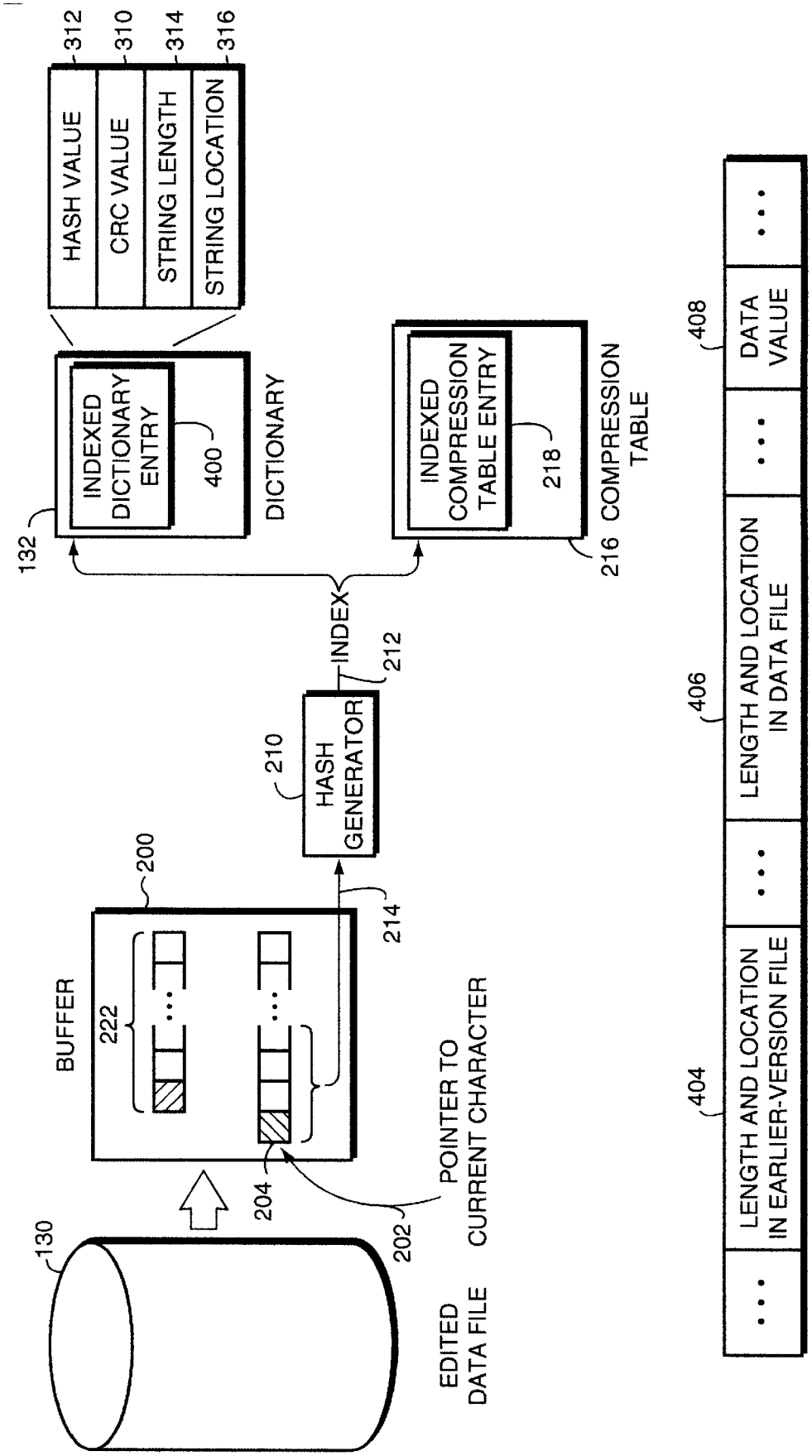
FIG. 4 is a more detailed block diagram of a portion of FIG. 1, namely of another part of the inventive data compressor.

This second scenario is illustrated in FIG. 4 and will now be described in more detail. The compressor 126 sequentially reads portions of the edited data file 130 into the buffer 200, as described above. The compressor 126 also advances the current-character pointer 202 through the data in the buffer 200, as described above.

For each current character 204 in the buffer 200, the compressor 126 uses the dictionary 132 to ascertain whether a character string that begins with the current character 204 is identical to a character string that occurs in the earlier version of the data file 108 (FIG. 1). The compressor 126 calculates a hash value 212 for the three-characters that begin with the current character 204. The compressor then uses the hash value 212 as an index into the dictionary 132. The compressor 126 compares the calculated hash value 212 with the hash value 312 stored in the indexed dictionary entry 400. If the two hash values are different, the compressor assumes that no identical string occurs in the earlier-version file 108. On the other hand, if one or more dictionary entries contain the calculated hash value 212, the compressor processes each of these entries in turn. For each of these dictionary entries, the compressor notes the CRC value 310 and the length 314 of the string in the earlier-version file 108.

The compressor then calculates a CRC value for a string that begins with the current character 204 in the buffer 200 and that has a length equal to the length 314 of the string in the earlier-version file 108. If the CRC value for the string in the buffer 200 is equivalent to the CRC value 310 of the string in the earlier-version file 108, the compressor assumes that the two strings are identical. In rare cases, two non-identical strings may yield identical CRC values and thus this assumption is erroneous; the compressor detects such errors by a method that is described later.

If the strings are assumed to be identical, the compressor 126 writes to a temporary file 402 an entry 404 that refers to the earlier-version file 108. The compressor 126 copies the string length 314 and string location 316 from the dictionary entry 400 to the temporary file entry 404. When the decompressor executes on the server 100, the decompressor reconstitutes the corresponding portion of the edited data file 130 by copying the identified string from the earlier-version file 108 to the new data file 134.

If no identical string is assumed to exist in the earlier-version file 108, the compressor 126 uses the compression table 216 to ascertain whether a character string that begins with the current character 204 is identical to a character string that occurs earlier in the buffer 200, as described above. If an identical string exists earlier in the buffer 200, the compressor writes to the temporary file 402 an entry 406 that includes the length and location in the data file 108 of the identical earlier string.

When the decompressor 124 executes on the server 100, the decompressor reconstitutes the corresponding portion of the edited data file 130 by copying the identical string from the location of its earlier occurrence in the reconstituted data file 134 (more accurately, from an output buffer (not shown)).

If the character string that begins with the current character 204 is neither identical to a character string that occurs in the earlier-version file 108 nor a character string that occurs earlier in the buffer 200, the compressor 126 writes to the temporary file 402 the data value 408 of the current character.

As the compressor 126 processes the edited data file 130, it creates a new dictionary (not shown) that describes the edited data file. After creating the new dictionary, the compressor 126 deletes the old dictionary 132.

After processing the entire edited data file 130, the compressor 126 encodes the temporary file 402 and sends it to the decompressor 124 on the server 100, as described above. The decompressor 124 reads the encoded temporary file and both reconstitutes a copy of the edited data file 134 and creates an optimum dictionary 136 on the server.

As described above, CRC values are used to compare two strings, but such a comparison can falsely indicate that two strings are identical. Therefore, the compressor 126 also calculates a CRC value for the entire data file 130 and sends this value to the decompressor 124. After the decompressor 124 reconstitutes the data file on the server 100, the decompressor calculates a CRC value for the reconstituted file. If the CRC values for the data file 130 and for the reconstituted file are not equal, the decompressor discards the reconstituted file and returns an error to the remote PC 106 so the remote PC can continue the transmission of the data file 130 by other means.

In an aspect of the invention, a single dictionary can describe multiple files. Such a dictionary provides advantages when the multiple files contain at least some common content, especially when several of the files are sent together to a receiving computer. For example, multiple C-language "include" files for a program or set of related programs typically contain many common strings. A dictionary that describes multiple files provides a larger "vocabulary" of incompressible strings than a dictionary that describes only one of the files. In addition, some strings might not occur frequently enough in any one of the files to justify describing the strings in a dictionary, but the strings might occur frequently enough in all of the files taken together.

Figure 5:
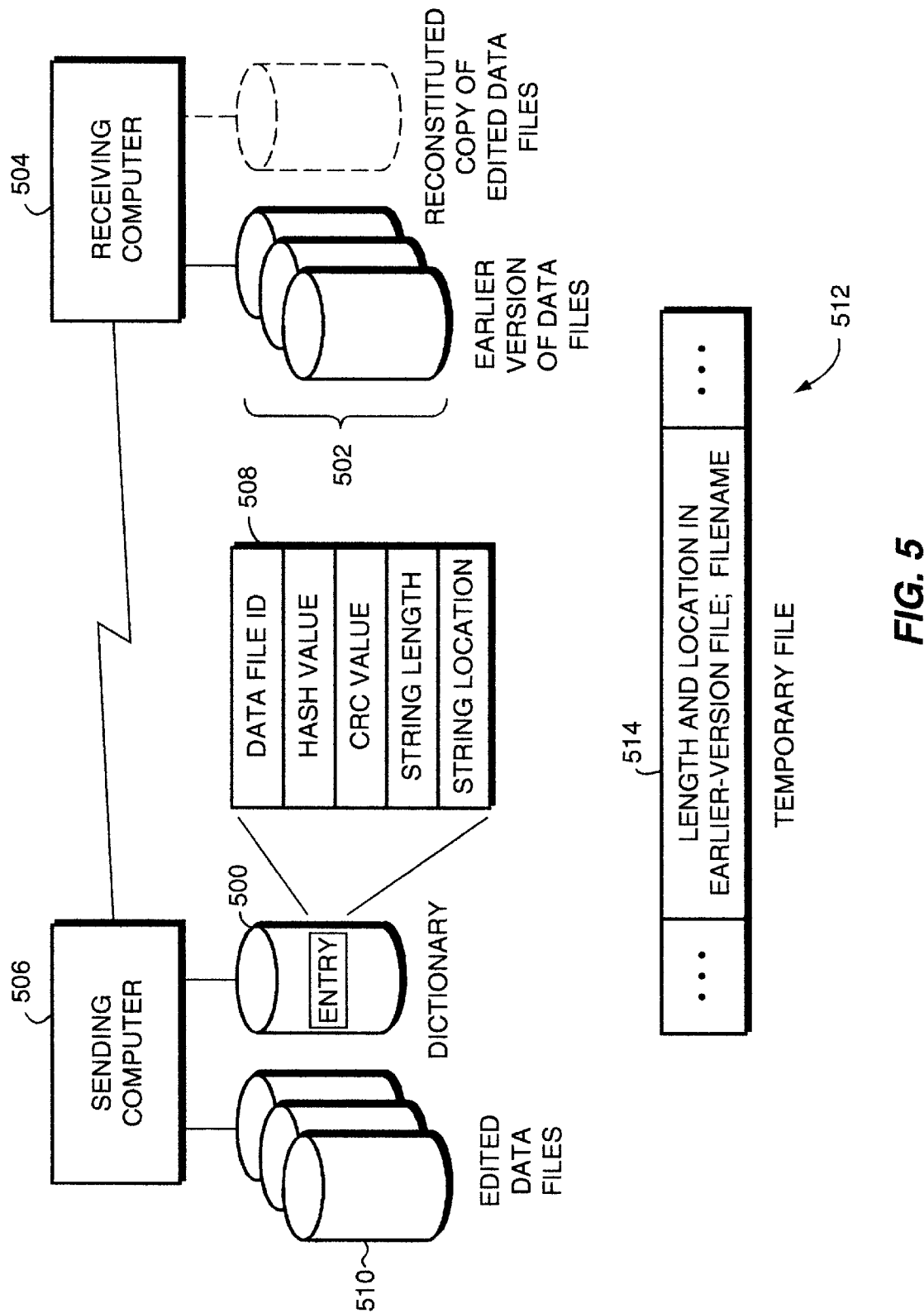
FIG. 5 is a block diagram of another exemplary configuration of computers in which the subject data compressor can be advantageously used, wherein the dictionary describes multiple files.

FIG. 5 illustrates a single dictionary 500 that describes multiple data files 502 stored on a receiving computer 504. A sending computer 506 stores the dictionary 500, which is created by concatenating the data files 502 and processing the concatenated data as though it were a single file. Each dictionary entry describes a string in one of the data files 502. Each dictionary entry further contains a data file ID 508 to identify which file contains the described string. In other respects, the contents and uses of the dictionary entries are similar to those described above. While compressing an edited version of one of the data files 510, if the compressor locates a string in the edited data file that is identical to a string in one of the earlier-version files 502, the compressor writes to a temporary file 512 an entry 514 that refers to the appropriate earlier-version file.

The description thusfar has been limited to compressing and sending one file at a time. However, with a single command, two or more of the edited data files 510 can be compressed and transmitted together to the receiving computer 504. In addition, the compressor can compress and send, in whole or in part: (1) directories of files, (2) directory structures, including subdirectories, (3) disks, and (4) servers.

In another aspect of the invention, a single compressor can concurrently compress and/or decompress data files that are received and/or sent by multiple computers. For example, referring again to FIG. 1, the compressor 124 on the server 100 can concurrently process data files sent and/or received by the remote PC 106 and the second server 122. Preferably the compressor 124 uses well-known "multi-threading" techniques to concurrently process these files. When the compressor is executed by a server computer under the control of a network operating system (NOS) such as the Novell NetWare operating system, the compressor is preferably implemented as a NetWare Loadable Module (NLM).

It will therefore be seen that I have developed a data compressor and method of creating a dictionary that describes variable-length strings of data, which can be utilized with a variety of data files and computer configurations, including servers and other computers. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of sending data from an input file that is stored by a sending computer, over a communication channel, to a receiving computer, the receiving computer storing earlier data, the method comprising the steps:

(a) providing to the sending computer one or more first keys, each first key corresponding to an incompressible group of data in the earlier data, each incompressible group of data in the earlier data comprising a respective portion of non-preset size of said earlier data and being located between two respective compressible groups of data in said earlier data;

(b) determining a second key that corresponds to a second group of data in the input file;

(c) ascertaining whether the second key matches one of the first keys;

(d) if the second key matches one of the first keys, sending a control signal from the sending computer to the receiving computer, the control signal causing the receiving computer to copy, from the earlier data, the incompressible group of data that corresponds to the matching first key;

(e) if the second key does not match any of the first keys, sending, from the sending computer to the receiving computer, a representation of at least some of the second group of data in the input file; and (f) repeating steps (b), (c), (d) and (e) for additional second groups of data in the input file until all data in the input file has been processed.

2. The method defined in claim 1, wherein step (a) comprises the steps of:

(a1) providing, on the sending computer, second earlier data that is identical to the earlier data stored by the receiving computer;

(a2) identifying one or more incompressible groups of data in the second earlier data; and (a3) for each identified incompressible group of data, determining a first key that corresponds to the identified incompressible group of data.

3. The method defined in claim 1, wherein step (a) comprises the steps of:

(a1) identifying one or more incompressible groups of data in the earlier data stored by the receiving computer;

(a2) for each identified incompressible group of data, determining a first key that corresponds to the identified incompressible group of data; and (a3) sending the determined first keys to the sending computer.

4. A method of producing a dictionary that contains descriptions of one or more incompressible groups of data, the incompressible groups of data being stored in one or more computer-readable files, the method comprising the steps:

(a) locating, in the one or more computer-readable files, a group of data that cannot be compressed in accordance with a compression method and that is located next to at least one group of data that can be compressed in accordance with said compression method, each of the located incompressible group of data and the group of data that can be compressed in accordance with said compression method being of a respective non-preset size;

(b) determining a key that corresponds to the located incompressible group of data;

(c) storing, in a memory, an address of the located incompressible group of data and the key that corresponds to the located incompressible group of data; and (d) repeating steps (a), (b) and (c) to produce each description in the dictionary.

5. The method defined in claim 4, wherein the address of the located incompressible group of data comprises an offset within the one or more computer-readable files of the located incompressible group of data and a length of the located incompressible group of data.

6. The method defined in claim 5, wherein the address of the located incompressible group of data further comprises an identification of one of the one or more computer-readable files.

7. The method defined in claim 4, wherein the key that corresponds to the located incompressible group of data is determined from at least some of the located incompressible group of data.

8. The method defined in claim 4, wherein the key comprises a CRC value that is calculated from at least some of the located incompressible group of data.

9. The method defined in claim 8, wherein the key additionally comprises a hash value that is calculated from at least some of the located incompressible group of data.

10. A method of sending data from an input file stored by a sending computer, over a communication channel, to a receiving computer, the method comprising the steps:

(a) dividing the input file into portions of respective non-preset sizes;

(b) for each portion of the input file:

(b1) selecting one of a plurality of compression methods;

(b2) processing the portion of the input file in accordance with the selected compression method to produce resulting data; and (b3) sending the resulting data from the sending computer, over the communication channel, to the receiving computer.

11. The method defined in claim 10, wherein the plurality of compression methods comprises a traditional compression method and a delta compression method.

12. The method defined in claim 11, wherein step (b1) comprises the step of ascertaining which of the plurality of compression methods can compress, with a larger compression ratio, each respective portion of the input file.

13. The method defined in claim 11, wherein step (b1) comprises the steps of:

(i) ascertaining whether each respective portion of the input file can be compressed using the delta compression method;

(ii) if a given portion of the input file can be compressed using the delta compression method, selecting the delta compression method otherwise selecting the traditional compression method.

14. The method defined in claim 11, wherein the receiving computer stores earlier data, the method additionally comprising the steps of:

(c) providing to the sending computer one or more dictionary entries, each dictionary entry corresponding to a portion of the earlier data;

(d) ascertaining whether a respective portion of the input file is described by one of the dictionary entries; and (e) if the respective portion of the input file is described by one of the dictionary entries, selecting the delta compression method otherwise selecting the traditional compression method.

15. The method defined in claim 14, wherein each dictionary entry stores a first CRC value ascertained from at least part of the corresponding portion of the earlier data and step (d) comprises the steps of:

(d1) ascertaining a second CRC value from the respective portion of the input file and (d2) ascertaining whether the second CRC value is equivalent to the first CRC value stored in one of the dictionary entries.

16. The method defined in claim 10, wherein said respective sizes permit said input file to be partitioned such that, if possible, at least one of said portions is more amenable to compression by a certain one of said compression methods than by another of said compression methods, and both said certain one and said another of said compression methods are used to compress said input file.

17. The method defined in claim 16, wherein said certain one of said compression methods comprises delta compression.

18. The method defined in claim 17, wherein said at least one portion is located between and is contiguous with two other respective portions of said input file that are more amenable to compression by said another compression method than by said delta compression.

19. The method defined in claim 18, wherein each of said at least one and said two other respective portions of said input file are of different respective sizes.

* * * * *